United States Patent [19]

Tsutsumi et al.

[11] Patent Number: 4,983,495

[45] Date of Patent: Jan. 8, 1991

[54] POSITIVE RESIST PATTERNS

[75] Inventors: Yoshitaka Tsutsumi, Shinnanyo; Toru Seita, Atsugi; Kousaburou Matsumura, Shinnanyo; Kyoko Nagaoka, Atsugi; Toshimitsu Yanagihara, Shinnanyo, all of Japan

[73] Assignee: Tosoh Corporation, Yamag, Japan

[21] Appl. No.: 456,624

[22] Filed: Dec. 29, 1989

Related U.S. Application Data

[63] Continuation of Ser. No. 235,410, Aug. 22, 1988, abandoned.

[30] Foreign Application Priority Data

Aug. 20, 1987 [JP] Japan .................... 62-205155

[51] Int. Cl.$^5$ .............................. G03F 7/039
[52] U.S. Cl. ...................... 430/270; 430/326; 526/245
[58] Field of Search ............... 430/270, 281, 326, 325; 526/245

[56] References Cited

U.S. PATENT DOCUMENTS

| | | | |
|---|---|---|---|
| 3,544,535 | 12/1970 | Gilbert et al. | 526/245 |
| 4,125,072 | 11/1978 | Kakuchi et al. | 428/421 |
| 4,259,407 | 3/1981 | Tada et al. | 428/421 |
| 4,822,721 | 4/1989 | Tsutsumi et al. | 526/245 |

FOREIGN PATENT DOCUMENTS

| | | | |
|---|---|---|---|
| 0230656 | 5/1987 | European Pat. Off. | 526/245 |
| 26 23813 | 6/1989 | France | 526/245 |
| 617311 | 6/1984 | Japan | 526/245 |
| 63-74054 | 4/1988 | Japan | 430/270 |

*Primary Examiner*—Marion E. McCamish
*Assistant Examiner*—Christopher D. RoDee
*Attorney, Agent, or Firm*—Sughrue, Mion, Zinn, Macpeak & Seas

[57] ABSTRACT

Positive resist patterns prepared by using a derivative of polyacrylic acid esters containing halogen expressed by the following general formula for the resist material;

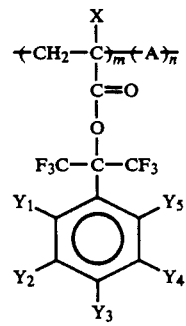

(where A is a structural unit which is derived from monomers having a copolymerable double bond, and X is either a halogen atom or a methyl group. m is a positive integer, n is 0 or a positive integer, n/m is 0 to 2 and m+n are 20 to 20,000. $Y_1$ to $Y_5$ are a fluorine or hydrogen atom and at least one of them is a fluorine atom).

22 Claims, No Drawings

POSITIVE RESIST PATTERNS

This a Continuation of application No. 07/235,410 filed Aug. 22, 1988 now abandoned.

BACKGROUND OF THE INVENTION

1. Field of the Invention

The present invention relates to a process for making positive resist patterns having high sensitivity and high resolution toward high energy radiations such as electron beam, X rays, and deep ultraviolet rays, as well as dry etching resistance. More particularly, the invention relates to a process for making resist patterns which employ derivatives of polyacrylate esters having halogen atom and benzene ring for use as resist material.

2. Description of the Related Art

As an electron beam positive resist, well known is polymethyl methacrylate (hereinafter abbreviated as PMMA). Although PMMA is a high resolution, it is less sensitive and poor against the dry etching. For high sensitivity, polymers of esters of methacrylic and acrylic acid or derivative thereof with mono or polyfluoroalkanols are used as material of positive resists for making patterns against electron beam and so on (Japanese Laid-Open Patent application No. Sho 55-18638 and No. Sho 60-254041 etc.), but this material has been proved to have insufficient resistance against the dry etching, as it is the case with PMMA. On the other hand, polyhenylmethacrylates show improved resistance against dry etching, but are still as low in sensitivity as PMMA.

On the other hand, polymers of 2-pentafluorophenyl-hexafluoroisopropyl esters of (meth-)acrylic acid are known, for example, in U.S. Pat. No. 3,544,535 etc., but it is still unknown whether or not these polymers can be employed as material for making positive resist.

Recently, various polymers containing halogens such as fluorine are being investigated to develop the field of application with particular care in manifesting their characteristics. Attention is paid to their high sensitivity toward electron and X rays when used for material of the resist. However, their shortcoming resistance against dry etching a defect in their application to resist materials, while dry processes are being developed in today's micro-technology.

The present invention which has been pursued with a view mentioned above intends to find resist patterns having the improved resistance against dry etching.

SUMMARY OF THE INVENTION

After intensive investigations with a view mentioned above, the present inventors have accomplished this invention.

The present invention relates to a process for making resist patterns comprising using derivatives of polyacrylic acid esters containing halogen expressed by the following general formula for the resist material;

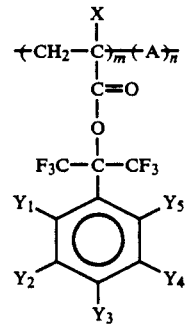

(where A is a structural unit which is derived from monomers having a copolymerable double bond, and X is either a halogen atom or a methyl group. m is a positive integer, n is 0 or a positive integer, n/m is 0 to 2 and m+n are 20 to 20,000. $Y_1$ to $Y_5$ are a fluorine or hydrogen atom and at least one of them is a fluorine atom).

The derivatives of polyacrylic acid esters containing halogen atoms to be used as the resist material of this invention are polymers of α-substituted acrylic acid esters with halogen atom or methyl group at the α-position and fluorine atom and benzene ring in the ester part which can be prepared by the polymerization of monomers of corresponding α-substituted acrylic acid ester. Chlorine atom is preferred as halogen at the α-position.

α-Chloroacrylic acid ester monomer, for instance, can be prepared in the following process. At first, acryloyl chloride is reacted with an alcohol which corresponds to the ester to be prepared, to obtain an acrylic acid ester. This substance is reacted with chlorine gas to prepare α, β-dichloropropionic acid ester. Addition of pyridine, distillation under a reduced pressure or reflux, filtration, extraction and separation by a column gave α-chloroacrylic acid ester monomers aimed at.

Alcohols which correspond to the esters to be produced can be prepared by the following processes. Thus, 2-pentafluorophenylhexafluoroisopropanol can be synthesized, for example according to U.S. Pat. No. 3,544,535, by the reaction of pentafluorobromobenzene and magnesium to prepare a Grignard's reagent which is then reacted with hexafluoroacetone.

The polymers used as resist material in the present invention can be prepared from monomers of α-halogenoacrylic acid esters or methacrylic acid esters by the bulk polymerization, the solution polymerization, and the emulsion polymerization. As initiator of the polymerization reactions serve peroxides such as hydrogen peroxide and benzoyl peroxide, azo compounds such as azo-bis-isobutylonitrile, and persulfates such as potassium persulfate.

The polymers to be used in the present invention can be also produced by the copolymerization reaction with those monomers which are capable of radical copolymerization and the same procedure as for monomers may be taken. These monomers (A) include acrylic acid esters such as methyl acrylate, ethyl acrylate and butyl acrylate; methacrylic acid esters such as 2-hydroxyethyl methacrylate and glycidyl methacrylate; α-substituted acrylic acid esters such as α-chloroacrylic acid methyl ester, α-trifluoromethylacrylic acid methyl esters and α-cyanoacrylic acid ethyl ester; unsaturated carboxylic acids such as acrylic, methacrylic and itaconic acids; acid amides such as acrylamide, methacrylamide and N-phenylmethacrylic amide; vinyl esters such as vinyl acetate and vinyl propionate; aromatic vinyl compounds such as styrene and α-methylstyrene; acrylonitrile and methacrylonitrile.

Now let n be the repeating unit of these compounds and m be the repeating unit of the polymer of α-halogenoacrylic or methacrylic acid ester. The ratio n/m should be in the range 0 to 2, preferably 0 to 1, and the degree of polymerization (m+n) in the range 20 to 20,000 (m and n have the same meaning as mentioned above). In case the degree of polymerization remains in this range, molecular weight of the resist material to be applied in the present invention lies between $5 \times 10^3$ and $10^7$, though the values depends on the molecular weight of monomers.

The present invention is characterized to be used for making resist patterns with exposure machine such as electron beam when the resist material is produced from a derivative of polyacrylic acid ester containing halogen.

For this end, those compounds which have a chlorine atom at the α-position are especially superior in the sensitivity toward electron beam and resistance against dry etching among the derivatives of polyacrylic acid esters containing halogen.

The procedure of this invention in which resist patterns are made with a derivative of polyacrylic acid ester containing halogen by means of electron beam may be carried out in an ordinary manner without any particular limitation. Thus, the solvent for application is not limited so long as it can dissolve the polymer and afford a uniform coating film. Solvents to be used may include xylene, toluene, benzene, tetrahydrofuran, ethyleneglycol monoethylether acetate and ethyleneglycol monomethylether acetate. The solvents may be used in conventional amounts, that is, for example, about 5 to 30 % of polyacrylic acid ester containing halogen of this invention to about 95 to 70% of a solvent.

For the developer solution may be used, for example, mixtures of those solvents mentioned above with an alcohol and mixtures of an ester or ketone solvent with an alcohol. Application, prebaking, exposure, development and all other procedures may be conducted according to the conventional manner.

Derivatives of polyacrylic acid esters containing halogen which are used for resist material of the present invention, especially those of α-halogen compounds, are the polymers of acrylic acid esters which contain halogen atom at the α-position and fluorine atom and a benzene ring at the ester part and the main chain of which undergoes decomposition reaction on irradiation of electron beam, X rays and deep ultraviolet rays, wherein the irradiated part becomes more soluble to solvent relative to the part not irradiated.

The radiations cited above also cause to decomposition the main chain of polymethyl methacrylate and polyphenyl methacrylate. The derivatives of polyacrylic acid esters containing halogen atom which are used as resist material of this invention, especially α-halogen compounds, more readily undergo the decomposition reaction because of the halogen atoms at the α-position and the ester part, and therefore increase their sensitivity toward the radiations. Also presence of the benzene ring enhances the resistance against dry etching.

DESCRIPTION OF PREFERRED EMBODIMENTS

The present invention will be explained in more detail referring to examples, but the invention is not limited thereto.

The test of sensitivity toward electron beam in the examples was carried out as described below;

At first, a solution of the polymer in ethyleneglycol monoethylether acetate or 1,4-Bis(trifluoromethyl) benzene was used to spin-coat on a silicon wafer, to form a 0.5 μm thick film. The silicon wafer was prebaked for 30 min at 200° C. and then some preferred portions on the film were irradiated with electron beam of an acceleration voltage 20 kV in various doses. Development was conducted by the immersion method at 24° C. to remove the irradiated portions selectively. The sensitivity and the degree of resolution were estimated from the sensitivity curve which expressed the relation between the dose and the remaining thickness of film after the development.

The sensitivity (hereinafter designated as S value) is expressed by the dose of irradiation which makes remaining thickness of film null. Also the degree of resolution (hereinafter designated as γ value) is expressed by the following equation:

$$|\log(S/Di)|^{-1}$$

Di is the irradiation dose at which the film thickness starts to decrease on the target line corresponding to the S-value of the sensitivity curve. The larger the degree of resolution is, the higher the resolving power is. (For details, see "Most recent technics in the application of fluorine compounds", pp.139–140, Apr. 24 (1981), CMC Co. Ltd.)

The test on the resistance against dry etching was carried out from observation on the resistance against reactive spattering of $CF_4$ gas using a dry etching apparatus DEM-451 (Manufactured by Nichiden Anelva).

EXAMPLE 1

Into a solution consisting of 66.8 g (0.2 mol) of 2-pentafluorophenylhexafluoroisopropanol, 21.7g (0.24 mol) of acryloyl chloride and 250 ml of ethylether, 24.2 g (0.24 mol) of triethylamine was added in drops under ice cooling in an hour. Salt formed was removed by filtration and the ethylether was evaporated for removal with an evaporator. Then 100 g of chloroform was added to 50 g of the reaction product above and under ice cooling a current of chlorine gas was introduced at a speed of 50 ml/min for 5 hours. Chloroform was removed by evaporation with an evaporator. Next, 10.3 g of pyridine and 100 ml of ethylether were added to 50 g of the reaction product above and the whole was agitated for 2 hours while being refluxed. After the precipitate was removed by filtration, ethylether was removed by evaporation, to obtained α-chloroacrylic acid 2-pentafluorophenylhexafluoroisopropyl ester.

In the next place, 3 g of α-chloroacrylic acid 2-pentafluorophenylhexafluoroisopropyl ester, 0.6 ml of a solution of azo-bis-isobutylonitrile in chloroform containing 0.1 % by weight of azo-bis-isobutylonitrile, and 1.5 ml of chloroform were taken in a flask and deaerated under vacuum according to the usual way. Next, the whole mixture was agitated at 70° C. for 5 hours, and the reaction mixture was poured into n-hexane to deposit the polymer formed which was then filtered and dried, to obtain poly-(α-chloroacrylic acid 2-pentafluorophenylhexafluoroisopropyl ester). The weight averaged molecular weight obtained by the GPC measurement was $4.5 \times 10^5$ when converted into polystyrene.

According to the test of sensitivity toward electron beam in which methylisobutylketone and isopropyl alcohol was used for the developer and the development was finished in 2 min. the S and the γ values for the positive type pattern produced were 5 μC/cm² and 3.5, respectively.

The test of dry etching resistance conducted using a CF4 gas evidenced an etching speed of 1750Å/min. For comparison, the etching speed of polymethyl methacrylate estimated in the same manner was 2200Å/min.

EXAMPLE 2

A mixture consisting of 3 g of methacrylic acid 2-pentafluorophenylhexafluoroisopropyl ester prepared according to U.S. Pat. No. 3,554,535, 0.6 ml of a solution of azo-bis-isobutylonitrile in chloroform containing 0.1% by weight of azo-bis-isobutylonitrile, and 1.5 ml of chloroform was introduced into a flask. Treatment according to Example 1 gave a poymer of which the weight-averaged molecular weight according to the GPC measurement was $4.1 \times 10^5$ when converted into polystyrene.

The test of sensitivity against electron beam, in which methyl isobutyl ketone/isopropyl alcohol were used for the developer and the development continued for 2 min, conducted with respect to the positive type pattern formed in the above treatment revealed the S and the γ values to be 12 μC/cm² and 3.2, respectively.

Further the test of dry etching resistance which was conducted on reactive sputtering with a CF4 gas gave 1720 Å/min for the etching speed.

What is claimed is:

1. A process for making positive resist patterns using a resist material comprising a derivative of polyacrylic acid esters containing halogen represented by the following general formula:

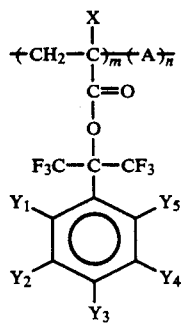

where A is a structural unit which is derived from monomers having a copolymerizable double bond selected from the group consisting of acrylic acid esters, methacrylic acid esters, substituted acrylic acid esters, unsaturated carboxylic acids, acid amides, vinyl esters, aromatic vinyl compounds, acrylonitrile and methacrylonitrile; X is a halogen atom; m is a positive integer, n is 0 or a positive integer, n/m is 0 to 2 and m+n are 20 to 20,000; $Y_1$ to $Y_5$ are a fluorine or hydrogen atom and at least one on $Y_1$ to $Y_5$ is a fluorine atom, comprising the steps of applying the resist material onto a substrate, irradiating the applied resist material, and developing the irradiated resist material to provide a positive resist pattern.

2. A process as in claim 1, wherein said acrylic acid esters are selected from methyl acrylate, ethyl acrylate and butyl acrylate.

3. A process as in claim 1, wherein said methacrylic acid esters are selected from 2-hydroxy-ethyl methacrylate and glycidyl methacrylate.

4. A process as in claim 1, wherein said α-substituted acrylic acid esters are selected from α-chloroacrylic acid methyl ester, α-trifluoromethylacrylic acid methyl ester and α-cyanoacrylic acid ethyl ester.

5. A process as in claim 1, wherein said unsaturated carboxylic acids are selected from acrylic, methacrylic and itaconic acids.

6. A process as in claim 1, wherein said acid amides are selected from acrylic amide, methacrylic amide and N-phenylmethacrylic amide.

7. A process as in claim 1, wherein said vinyl esters are selected from vinyl acetate and vinyl propionate.

8. A process as in claim 1, wherein said aromatic vinyl compounds are selected from styrene and α-methyl-styrene.

9. A positive resist for preparation of positive resist patterns by irradiation with electron beams, X-rays and deep ultraviolet rays, comprising a derivative of polyacrylic acid esters containing halogen represented by the following general formula:

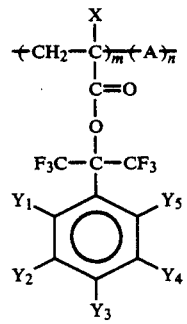

where A is a structural unit which is derived from monomers having a copolymerizable double bond selected from the group consisting of acrylic acid esters, methacrylic acid esters, α-substituted acrylic acid esters, unsaturated carboxylic acids, acid amides, vinyl esters, aromatic vinyl compounds, acrylonitrile and methacrylonitrile; X is a halogen atom; m is a positive integer, n is 0 or a positive integer, n/m is 0 to 2 and m+n are 20 to 20,000; $Y_1$ to $Y_5$ are a fluorine or hydrogen atom and at least one of $Y_1$ to $Y_5$ is a fluorine atom.

10. A positive resist according to claim 9, wherein A is a methacrylic acid ester.

11. A positive resist according to claim 9, wherein X is Cl.

12. A positive resist according to claim 9, wherein n is 0.

13. A positive resist as in claim 9, wherein said acrylic acid esters are selected from methyl acrylate, ethyl acrylate and butyl acrylate.

14. A positive resist as in claim 9, wherein said methacrylic acid esters are selected from 2-hydroxyethyl methacrylate and glycidyl methacrylate.

15. A positive resist as in claim 9, wherein said α-substituted acrylic acid esters are selected from α-chloroacrylic acid methyl ester, α-trifluoromethyl-acrylic acid methyl ester and α-cyanoacrylic acid ethyl ester.

16. A positive resist as in claim 9, wherein said unsaturated carboxylic acids are selected from acrylic, methacrylic and itaconic acids.

17. A positive resist as in claim 9, wherein said acid amides are selected from acrylic amide, methacrylic amide and N-phenylmethacrylic amide.

18. A positive resist as in claim 9, wherein said vinyl esters are selected from vinyl acetate and vinyl propionate.

19. A positive resist as in claim 9, wherein said aromatic vinyl compounds are selected from styrene and α-methyl-styrene.

20. A positive resist for the preparation of positive resist patterns by irradiation with electron beams, X-rays and deep ultraviolet rays, comprising a derivative of polyacrylic acid esters containing halogen represented by the following general formula:

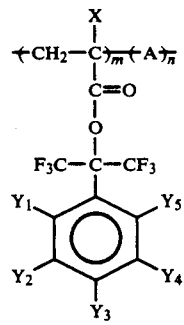

where A is a repeating unit derived from a methacrylic acid monomer component having a copolymerizable double bond; X is a halogen atom; m is a positive integer, n is 0 or a positive integer, n/m is 0 to 2 and m+n are 20 to 20,000; $Y_1$ to $Y_5$ are a fluorine or hydrogen atom and at least one of $Y_1$ to $Y_5$ is a fluorine atom.

21. A positive resist according to claim 20, wherein X is Cl.

22. A positive resist according to claim 20, wherein n is 0.

* * * * *